United States Patent [19]

Tabata et al.

[11] Patent Number: 4,824,794

[45] Date of Patent: Apr. 25, 1989

[54] METHOD FOR FABRICATING A BIPOLAR TRANSISTOR HAVING SELF ALIGNED BASE AND EMITTER

[75] Inventors: Akira Tabata, Zama; Motoshu Miyajima, Kawasaki; Kazushi Kawaguchi, Yokohama, all of Japan

[73] Assignee: Fujitsu Limited, Kanagawa, Japan

[21] Appl. No.: 170,618

[22] Filed: Mar. 14, 1988

Related U.S. Application Data

[63] Continuation of Ser. No. 902,835, Sep. 2, 1986, abandoned.

[30] Foreign Application Priority Data

Sep. 2, 1985 [JP] Japan .................. 60-191959

[51] Int. Cl.⁴ .......................... H01L 21/265
[52] U.S. Cl. ...................... 437/33; 437/31; 437/89; 437/92; 437/191; 437/238; 437/241; 148/DIG. 10; 148/DIG. 11; 148/DIG. 117
[58] Field of Search .............. 437/31, 32, 33, 191, 437/81, 82, 89, 90, 91, 92, 193, 186, 225, 228, 233, 238, 241; 148/DIG. 10, DIG. 11, DIG. 50, DIG. 117; 357/34, 59 H

[56] References Cited

U.S. PATENT DOCUMENTS

| | | | |
|---|---|---|---|
| 3,189,973 | 6/1965 | Edwards et al. | 357/59 H |
| 4,481,706 | 11/1984 | Roche | 156/653 |
| 4,483,726 | 11/1984 | Isaac et al. | 148/187 |
| 4,495,010 | 1/1985 | Kranzer | 357/59 H |
| 4,610,730 | 9/1986 | Harrington et al. | 148/DIG. 10 |
| 4,641,416 | 2/1987 | Irawmanesh et al. | 148/DIG. 10 |
| 4,663,831 | 5/1987 | Birritt et al. | 437/33 |
| 4,749,661 | 6/1988 | Bauer | 437/33 |

FOREIGN PATENT DOCUMENTS 3400295  1/1983  France .................. 148/DIG. 10

OTHER PUBLICATIONS

Nakamura et al. "High Speed IIL . . . " IEEE Trans. Elec. Dev., vol. E D32, No. 2, Feb. 1983, pp. 248-252.
Karaka et al, "A 30 PS Bipolar 1C . . . " Extended abstract of the 16th Conference on Solid State Devices and Materials 1984 pp. 209-212.
Journal of Electrochemical Soc. Sep. 1984, pp. 2138-2142 "Corner Undercutting in Anisotropically Etched Isolation Contours" by M. M. Abuzeich.
Appl. Phys. ltr. vol. 26, No. 4, Feb. 1975, pp. 195-198 "On Etching Very Narrow Grooves in Silicon" by Don L. Kendall.
Journal of Electrochemical Soc., Apr. 1975, pp. 545-552 "Optimization of the Hydrazine-Water Solution for Anisotropic Etching of Silicon in Integrated Circuit Technology" by Michal J. Declecq et al.

*Primary Examiner*—Brian E. Hearn
*Assistant Examiner*—Kevin McAndrews
*Attorney, Agent, or Firm*—Armstrong, Nikaido, Marmelstein & Kubovcik

[57] ABSTRACT

A bipolar transistor having self-aligned base and emitter regions is fabricated in a silicon layer which is epitaxially grown on a substrate so as to fill up a cavity formed through a polysilicon layer deposited on the substrate. The polysilicon layer is doped with impurities for creating an extrinsic base region in the epitaxially grown silicon layer and is insulated from the emitter electrode by a dielectric layer formed thereon. The dielectric layer can be provided by selectively oxidizing the polysilicon layer. Thus, the step formed at the emitter electrode is small and equal to the thickness of the dielectric layer, about 3000 Å, for example, thereby eliminating the faulty step coverage in the prior art self-aligned bipolar transistor usually having the step as large as 1 micron.

22 Claims, 5 Drawing Sheets

METHOD FOR FABRICATING A BIPOLAR TRANSISTOR HAVING SELF ALIGNED BASE AND EMITTER

This application is a continuation of application Ser. No. 902,835 filed Sept. 2, 1986, now abandoned.

BACKGROUND OF THE INVENTION

The present invention relates to a method for fabricating a bipolar transistor, particularly to an improvement in the reliability of contact to the emitter of a bipolar transistor having a self-aligned base and emitter.

To increase the packing density and the operation speed of bipolar ICs or LSIs, a scale down in size and an improvement in the performance of bipolar transistors incorporated therein are indispensable. For this end, a dielectric isolation technology using insulating layers is substituted for the p-n junction isolation in order to decrease the size of the bipolar transistors. Also, a shallow base and emitter structure is employed for providing a thin base region necessary for the high speed operation, thereby improving the high frequency characteristics. There are disclosed various fabrication methods for providing bipolar transistors as mentioned above, including the most popular one referred to as "isoplanar technology".

For instance, "Self-Aligned Bipolar Transistors for High-Performance and Low-Power-Delay VLSI", IEEE, Transaction on Electron Device, Vol.ED-28, No.9, September 1981, pp. 1010–1013 describes a bipolar transistor having a self-aligned base and emitter regions formed shallow and adjacent to the surface of a semiconductor substrate by ion injections. FIG. 1 is a cross-section illustrating an exemplary configuration of a bipolar transistor fabricated in accordance with the disclosure. Referring to FIG. 1, shallow base region 51 and emitter region 61 are formed adjacent to the surface of a semiconductor substrate 40 having p-type conductivity, for example. The shallow and thin intrinsic base region 51 is connected to a base terminal 52 via an extrinsic base region 53 which is formed by diffusing p-type impurities from a doped polysilicon layer 54. The emitter region 61 is connected to an emitter terminal 62 which is insulated from the polysilicon layer 54 by oxide layers 55 and 56. The oxide layer 55 is formed on the side wall surface of an opening which is provided in the polysilicon layer 54. The oxide layer 56 is formed on the polysilicon layer 54. The collector region of the transistor is connected, as conventional, to a collector terminal 63 via a buried layer 64 and an N collector contact region 65. Because the base region 51 and emitter region 61 are self-aligned thanks to the opening formed in the polysilicon layer 54, and also, the base terminal 52 is formed on the isolation oxide layer 41, the bipolar transistor can have high performance and become suitable to use with high density integrated circuits.

However, in the structure as shown in FIG. 1, the contact to the emitter region 61 is formed in a recess which is deep from the top surface of the surrounding layer 56. Accordingly, the connection to the emitter region 61 must be established through a steep step as large as about 1 micron in the emitter terminal 62. The steep and large step should produce a faulty coverage in the conductor layer formed thereon. Such faulty step coverage sometimes becomes apparent, when resulting in a disconnection in the emitter contact, after a long operation of the bipolar transistor in the field. Thus, the faulty step coverage decreases the reliability of equipment or a system comprising such kind of bipolar transistors.

SUMMARY OF THE INVENTION

It is therefore an object of the present invention to provide a method for fabricating a bipolar transistor having self-aligned base and emitter, which bipolar transistor is prevented from having the above faulty step coverage at the emitter terminal thereof.

It is another object of the present invention to provide a method for fabricating a bipolar transistor having self-aligned base and emitter, the bipolar transistor being increased of the reliability in its long term operation.

The above objects can be attained by a fabrication method for a bipolar transistor in accordance with the present invention, wherein the method comprises steps of:

(i) selectively forming an isolation region on a substrate so as to surround a single crystal semiconductor region having a first conductivity type;

(ii) forming a polycrystalline semiconductor layer on the single crystal semiconductor region, the polycrystalline layer extending to a portion of the isolation region adjacent to the single crystal semiconductor region;

(iii) injecting second conductivity type impurities into the polycrystalline semiconductor layer;

(iv) selectively forming a dielectric layer on the polycrystalline semiconductor layer, so that the dielectric layer is provided with an opening to expose therefrom a portion of the polycrystalline semiconductor layer in the single crystal semiconductor region;

(v) removing the exposed portion of the polycrystalline semiconductor layer until the corresponding portion of the single crystal semiconductor region is exposed, wherein a predetermined amount of undercut is provided in the polycrystalline semiconductor layer under the dielectric layer around the opening;

(vi) epitaxially growing a semiconductor layer on the exposed portion of the single crystal semiconductor region so that the removed portion of the polycrystalline semiconductor layer is filled up with the epitaxially grown semiconductor layer;

(vii) annealing the substrate so that the second conductivity type impurities injected into the polycrystalline semiconductor layer diffuse into at least the periphery of the epitaxially grown semiconductor layer;

(viii) selectively injecting second conductivity type impurities and subsequently first conductivity type impurities into the epitaxially grown semiconductor layer, so that base and emitter regions for the bipolar transistor are respectively formed in the epitaxially grown semiconductor layer; and (ix) selectively forming a conductor layer on the epitaxially grown semiconductor layer doped with the first conductivity type impurities, such that an emitter electrode for the bipolar transistor is provided.

Many other features, advantages and additional objects of the present invention will become manifest to those in art upon making reference to the detailed description which follows and the accompanying drawings.

DESCRIPTION OF A PREFERRED EMBODIMENT

An embodiment of the present invention is described in a preferred form of fabricating an npn bipolar transistor in the following with reference to the accompanying drawings.

Figure 2:
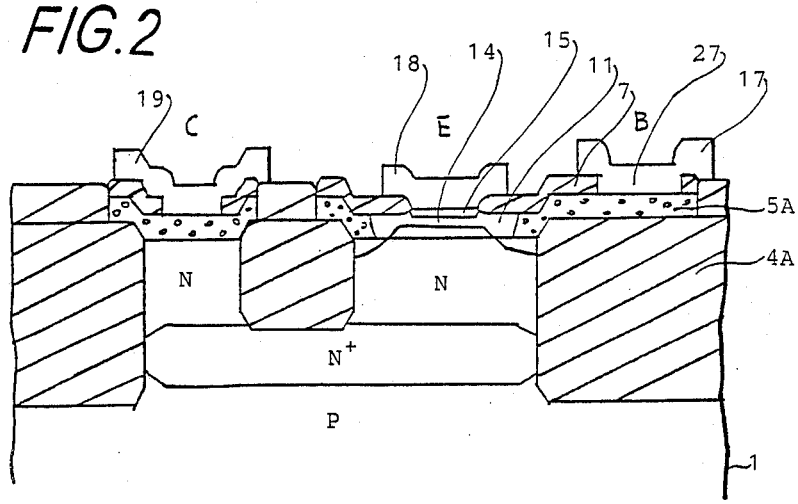
FIG. 2 is a schematic cross-section of a self-aligned npn bipolar transistor fabricated according to the present invention.

FIG. 2 is a schematic cross-section of an npn bipolar transistor fabricated according to the present invention. FIG. 2 can also be regarded as a cross-section of one of transistors incorporated in a bipolar IC. FIGS. 3 to 11 are schematic cross-sections illustrating respective configurations of the bipolar transistor shown in FIG. 2 at different steps of the manufacturing process therefor.

Figure 1:
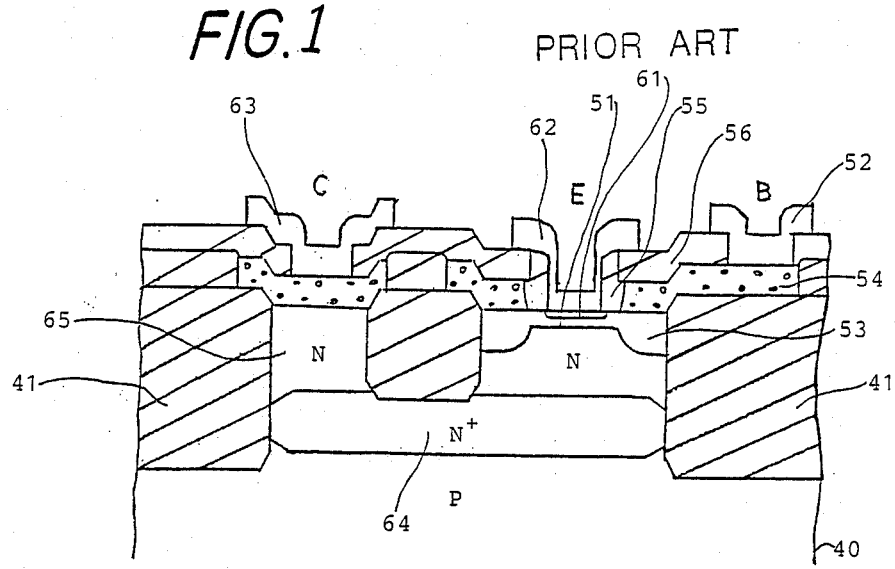
FIG. 1 is a schematic cross-section illustrating an exemplary configuration of a prior art bipolar transistor having self-aligned base and emitter.

In the bipolar transistor shown in FIG. 2, there is only a smaller step at the emitter terminal 18, as compared with the prior art transistor shown in FIG. 1. This is because the self-aligned base and emitter are formed in the silicon layer 11 epitaxially grown on the substrate 1, and therefore, the step at the emitter terminal 18 is only the thickness of the dielectric layer 7 formed on the polysilicon layer 5.

Figure 3:
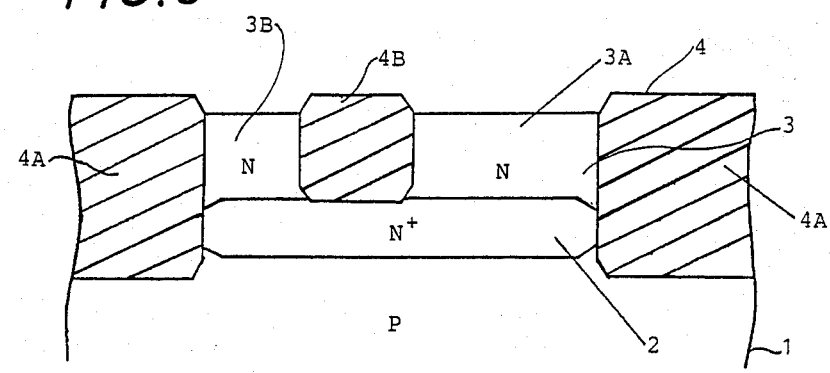
FIGS. 3 to 12 are schematic cross-sections illustrating respective configurations of the bipolar transistor shown in FIG. 2 at different steps of in the manufacturing process therefor.

Referring to FIG. 3, an N-type single crystal silicon layer 3 is epitaxially grown on the entire surface of a P-type silicon substrate 1 having a surface oriented in (111) direction, according to a conventional art. The substrate 1 has an N+ buried layer 2 selectively formed therein in advance. Then, the single crystal silicon region 3 is selectively oxidized to form isolation regions 4A and 4B by using a conventional LOCOS (local oxidation of silicon) technology. Thus, single crystal semiconductor regions 3A and 3B are formed to be surrounded by the isolation regions 4A and 4B on the substrate 1. The isolation region 4A electrically isolate the transistor formed in the single crystal region 3A from other transistors on the substrate 1. The isolation region 4B electrically insulates single crystal regions 3A and 3B from each other. Another isolation scheme such as a U- or V-shaped trench may be used for replacing the isolation region 4A. The isolation region 4B may be thinner than the region 4A as far as it can isolate the single crystal regions 3A and 3B.

Figure 4:
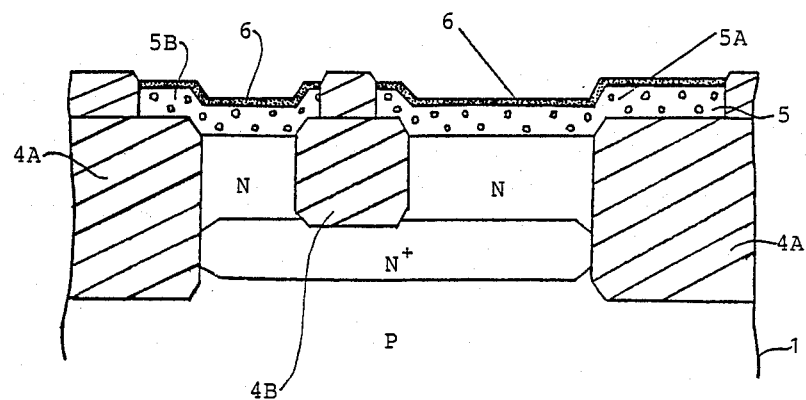

Referring to FIG. 4, a polysilicon layer 5 is formed on the entire surface of the substrate 1 by using a conventional CVD (chemical vapor deposition) technology. The polysilicon layer 5 is selectively oxidized in accordance with a conventional selective thermal oxidation technology using a patterned mask layers 6 of an oxidation resistive material such as silicon nitride (Si3N4) of 700 Å thickness, for example, formed on the polysilicon layer 5. Thus, patterns of polysilicon layers 5A and 5B are formed to respectively cover the single crystal regions 3A and 3B. The polysilicon layer pattern 5A is formed to extend to the isolation region 4A.

Figure 5:
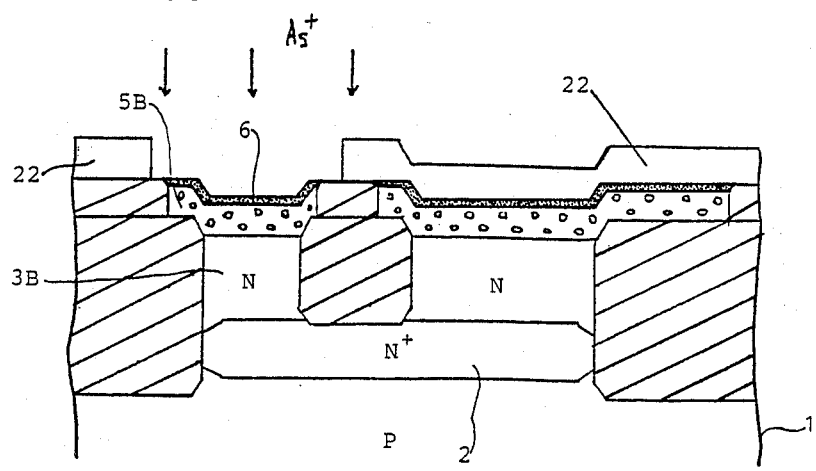

Referring to FIG. 5, a mask layer of a resist material 22 is formed on the substrate 1 so as to expose a portion, corresponding to the region 3B, and then, n-type impurities ions such as arsenic ions (As+) are injected into the polysilicon layer 5B through the Si3N4 layer 6 by using a conventional ion implantation technology. Exemplary figures for the arsenic ion implantation include a dosage of $5 \times 10^{15}$ ions/cm$^2$ and ion energy of 60 KeV. Subsequently, an annealing at 1100° C. for 30 minutes, for instance, is preferably provided to drive the arsenic atoms in the polysilicon layer 5B to distribute in the single crystal silicon region 3B. Thus, the region 3B constitutes a collector contact via the buried layer 2.

Figure 6:
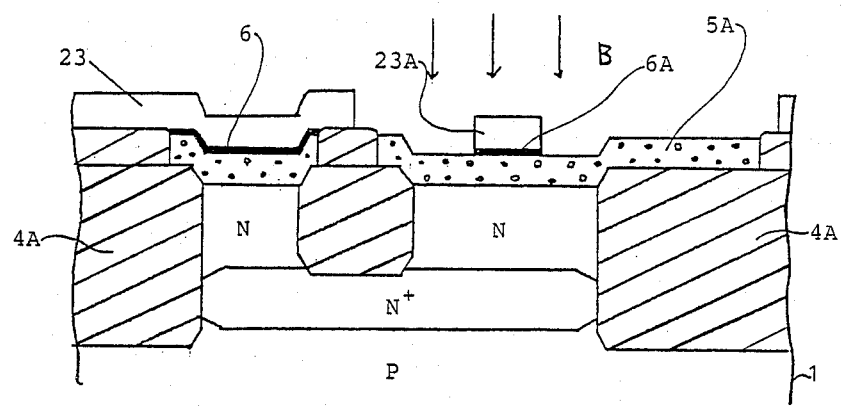

Referring to FIG. 6, another resist layer 23 is applied to the substrate 1 after the removal of the resist mask layer 22 used in the process described with reference to FIG. 5. The resist layer 23 is patterned to expose the polysilicon layer 5A except a predetermined portion thereof covered by an island like pattern 23A of the resist layer 23. Then, P-type impurities, boron ions (B+), for example, are injected into the polysilicon layer 5A by using a conventional ion implantation technology. Exemplary figures for the boron ion implantation include the dosage of $1 \times 10^{16}$ ions/cm$^2$ and ion energy of 40 KeV. The injected boron atoms increase the conductivity of the polysilicon layer 5A. Further, the boron-implanted polysilicon layer 5 plays a role of a source of donor impurities for creating an extrinsic base region as described later. In FIG. 6, the Si3N4 layer 6 is selectively removed together with the resist layer 23A so as to provide a underlying pattern 6A prior to the boron ion implantation, but it may be left on the entire surface of the polysilicon layer 5A until the boron implantation has been performed. Moreover, the boron ion implantation may be conducted entirely on the polysilicon layer 5A without providing the island pattern 23A of the resist layer 23.

Figure 7:
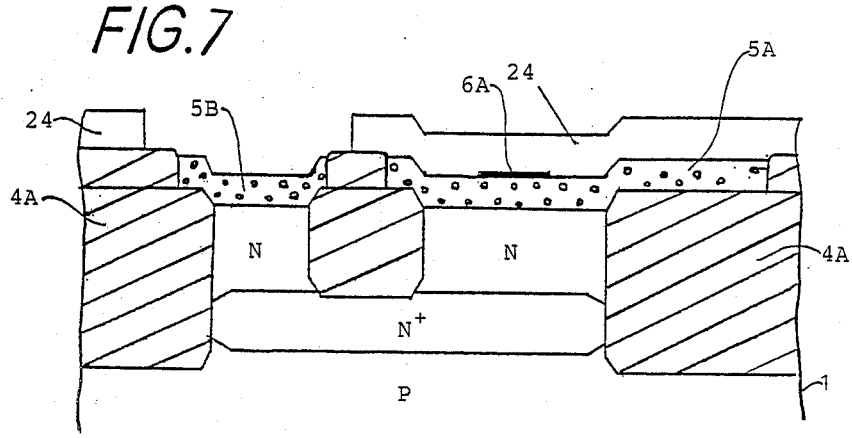

Subsequent to the implantation of p-type impurities, the resist layer 23 is removed, and a further another resist layer 24 is formed to expose the polysilicon layer 5B, as shown in FIG. 7. Thus, the Si3N4 layer 6 (see FIG. 6) on the polysilicon layer 5B is selectively removed by a conventional etching process. The Si3N4 layer 6 on the polysilicon layer 5A can be patterned to provide the island pattern 6A in this step, if the polysilicon layer 5A is entirely covered with a Si3N4 layer during the boron ion implantation provided thereto. A thermal process for annealing the ion implanted polysilicon layers 5A and 5B is carried out, if desired.

Figure 8:
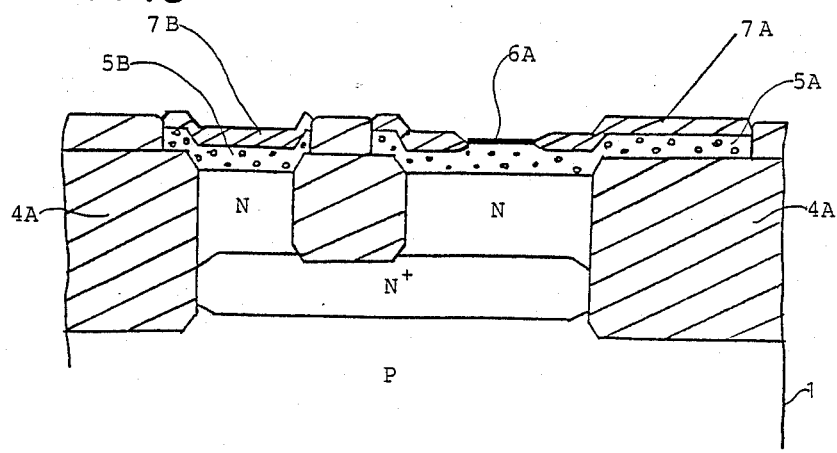

A thermal oxidation process is conducted for producing a silicon oxide layer (SiO$_2$) 7 on the surface of the polysilicon layers 5A and 5B, as shown in FIG. 8. None of oxide layer is formed on the surface portion of the polysilicon layer 5A, covered with the Si3N4 layer 6A. In the above, the thermal oxidation process can substitute for the annealing process of the boron injected polysilicon layers 5A. Each of the annealing and thermal oxidation processes should be performed at a low temperature so that the boron atoms injected in the polysilicon layer 5A do not diffuse into the single crystal region 3A. Therefore, so-called high pressure oxidation at a temperature 900° to 950° C. in a wet oxygen of about 5 atms for approximately 20 minutes is preferable for the thermal oxidation. Thus, silicon oxide layers 7A and 7B of about 3000 Å thickness are respectively formed on the polysilicon layers 5A and 5B.

In the above, the oxide layer (dielectric layer) 7A is formed by a selective thermal oxidation of the polysilicon layer 5A using the Si3N4 mask layer 6A, after the boron ion implantation. However, an equivalent dielectric layer can be formed by a conventional thin film deposition technology, sputtering, for example, and photolithography. In this alternative method, a resist pattern corresponding to 23A in FIG. 6, formed as the mask for the boron implantation for the polysilicon layer 5A may also be used as the mask for the deposition of the dielectric layer, because the dielectric layer deposited on the resist layer 23A can selectively be removed by a lift-off method.

Figure 9:
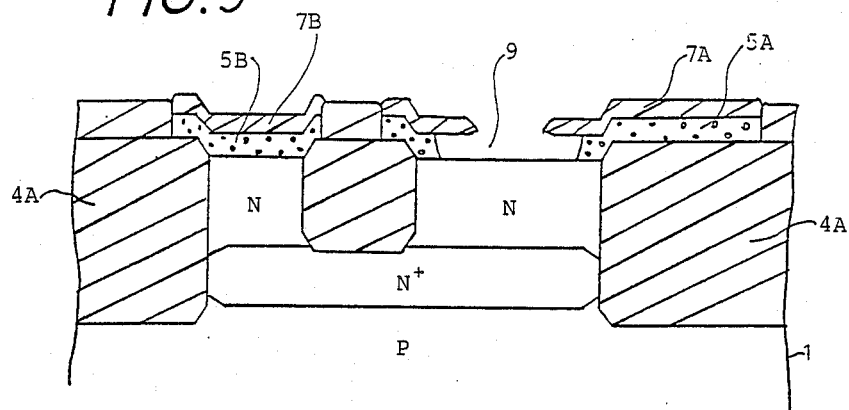

Following the above, $Si_3N_4$ mask layer 6A is removed by using a suitable etchant, thus the polysilicon layer 5A is partially exposed through the opening formed in the oxide layer 7A, corresponding to the removed mask layer 6. Subsequently, the exposed polysilicon layer pattern 5A is etched off by using an etchant such as KOH (potassium hydroxide) solution. KOH has a high etching capability for the polysilicon but substantially nothing for the single crystal silicon having a surface of (111) crystal orientation. Accordingly, the polysilicon layer 5A is selectively etched off, even if the single crystal region 3A is exposed. When the polysilicon layer 5A at the opening is etched throughout the thickness thereof, a side etch corresponding to the thickness occurs in the polysilicon layer 5A. Thus, a space (cavity) 9 having an undercut portion around the opening is formed in the polysilicon layer 5A, as shown in FIG. 9. Other etchant such as ethylene diamine and hydrazine solutions may be preferably employed to substitute for KOH solution.

Figure 10:
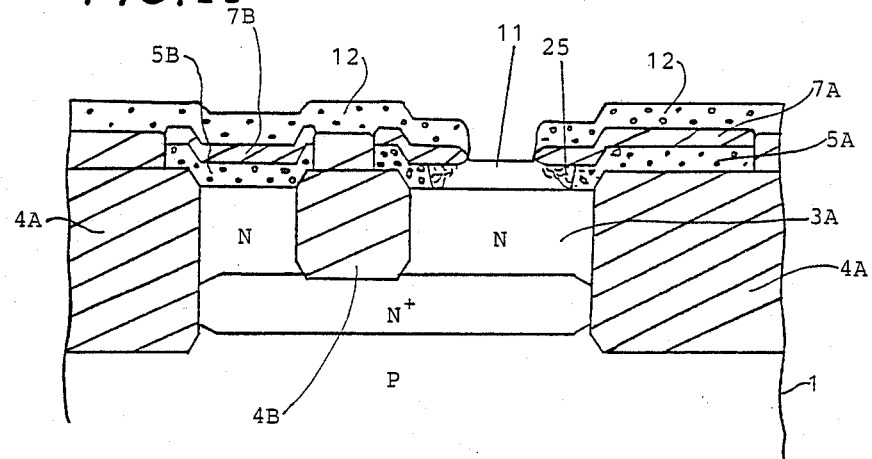

A silicon layer is deposited on the surface of the substrate by using a vapor phase growth, for example. As shown in FIG. 10, a single crystal silicon layer 11 is epitaxially grown on the exposed surface of the single crystal region 3A, while a polysilicon layer 12 is formed on the isolation regions 4A and 4B and the dielectric layers 7A and 7B. Thus, the cavity 9 is filled up with the epitaxially grown silicon layer 11. Another suitable epitaxial growth technique, a liquid phase epitaxy, for instance, may be used for growing a single crystal silicon layer in the cavity 9. It should be noted that the undercut portion provided in the cavity 9 (see FIG. 9) can keep the portion of the epitaxially grown silicon layer 11, corresponding to the opening in the dielectric layer 7A, free from lattice defects 25 generated at the etched side surface of the polysilicon layer 5A. Thus, self-aligned base and emitter can be formed in the lattice-defect-free silicon layer. If the undercut portion is not provided, such lattice defects encroaches on the epitaxially grown silicon layer 11, hence, decreasing the effective area of the silicon layer 11, and another mask is needed to define base and emitter regions in the decreased effective area.

Figure 11:
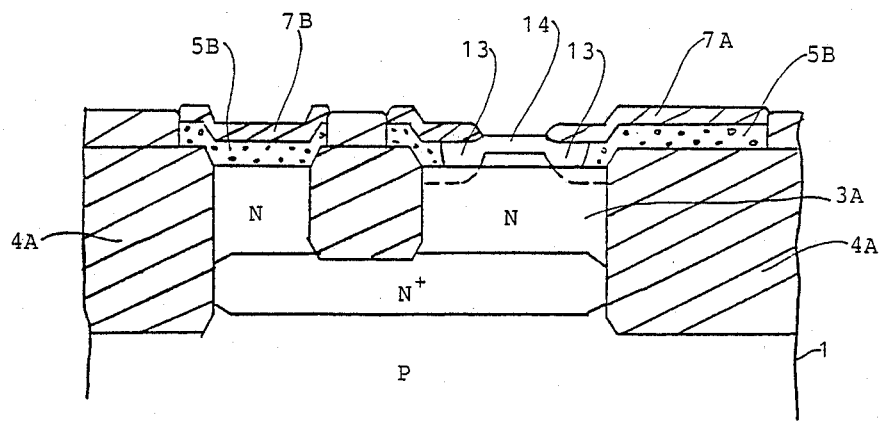

Following the above, the polysilicon layer 12 is entirely removed by using a suitable etchant such as the above KOH solution. Hence, the epitaxially grown silicon layer 11 can be prevented from the etching and an almost flat surface level is established between the silicon layer 11 and the oxide layer 7A, as shown in FIG. 11. Subsequently, the substrate 1 is subjected to a heating at a temperature between 1000° and 1150° C. for 10 to 20 minutes in an inert atmosphere such as gaseous nitrogen. Thus, the ion-injected boron atoms in the polysilicon layer 5A are out-diffused into the silicon layer 11 so as to form a P-type (second conductivity type) extrinsic base region 13 extending across the layers 11 and 3A.

Then, impurity injection to form an intrinsic base region in the epitaxially grown silicon layer 11 is performed by using a conventional ion injection technology, for example, in which boron is employed for the donor impurities and the oxide layers 7A and 7B are utilized as masks. An exemplary figures for the donor ion injection include a dosage of $5 \times 10^{13}$ ions/cm$^2$ and ion energy of 40 KeV. Then, the substrate 1 is subjected to an annealing process at a temperature about 900° C. for approximately 10 minutes in an inert gas atmosphere such as gaseous nitrogen. Thus, the intrinsic base region 14 and extrinsic base region 13 become a continuous P-type region as shown in FIG. 11.

Figure 12:
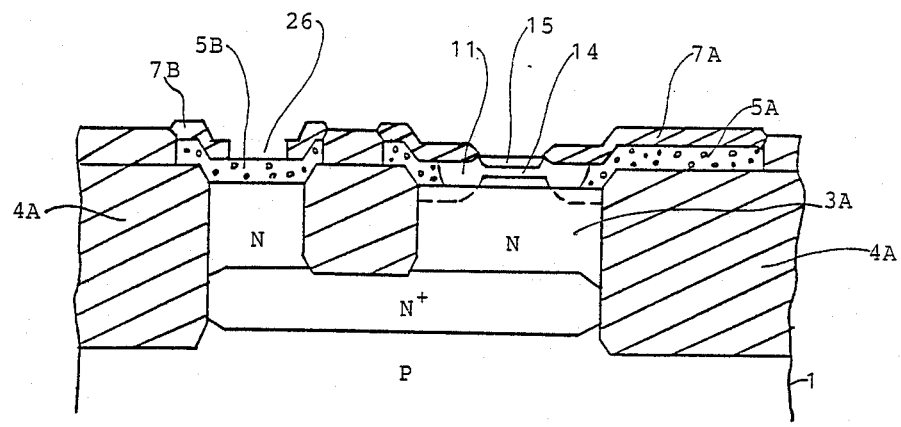

Referring to FIG. 12, a contact hole 26 is formed in the oxide layer 7B on the polysilicon layer 5B by using a conventional photolithography. Subsequently, acceptor impurity injection is carried out to form an emitter region 15 by using a conventional ion implantation technology, for example, in which arsenic is employed for the acceptor impurities and the oxide layers 7A and 7B are utilized as masks. An exemplary figures for the acceptor injection include a dosage of $5 \times 10^{15}$ ions/cm$^2$ and ion energy of 60 KeV. Thus, the emitter region 15 is self-aligned to the intrinsic base region 14. At the same time, the arsenic ions are injected to the polysilicon layer pattern 5B through the contact hole 26. The substrate 1 is, then, annealed at a temperature about 1100° C. for a short time period such as 10 to 20 seconds in an inert gas atmosphere such as gaseous nitrogen. Thus, the arsenic acceptor impurities do not diffuse deep into the silicon layer 11 and, hence, a shallow base-emitter junction is formed.

Referring back to FIG. 2, another contact hole 27 is formed in the oxide layer 7 so as to partially expose the polysilicon layer 5A extending to the isolation region 4A. Then, electrode patterns 17, 18 and 19 are formed on the substrate 1, respectively contacting to the polysilicon layer 5A, the emitter region 15 and the polysilicon layer 5B for the collector contact. Thus, the polysilicon layer 5A constitutes a base contact. These electrodes are from an aluminum layer, for instance, which is vacuum deposited on the substrate 1 and then patterned according to a conventional photolithography. As described above, a bipolar transistor having shallow emitter region which is self-aligned to the intrinsic base region thereof is obtained. Of importance, in the bipolar transistor fabricated according to the present invention method, the emitter region is formed substantially flat on the substrate, and hence, the faulty step coverage at the emitter electrode as in the prior art bipolar transistor can be eliminated. Thus, a reliable bipolar transistor or IC applicable to a long term operation can be provided. Further, as in the self-aligned prior art bipolar transistor, the features of the self-alignment of base and emitter regions and the precision shallow base-emitter junction in the present invention bipolar transistor contribute to the fabrication of high integration density and high performance bipolar ICs.

It is understood by those skilled in the art that the foregoing description is a preferred embodiment of the method and that various changes and modification may be made in the invention without departing from the spirit and scope thereof. For example, in the above, the boron ion implantation into the polysilicon layer 5A may be performed after the selective oxidation of the polysilicon layer 5A, instead of the selective implantation which is performed prior to the selective oxidation by using the resist layer mask 6A, as explained with reference to FIG. 6.

We claim:

1. A method for fabricating a bipolar transistor in a substrate having a single crystal semiconductor region on the surface thereof, comprising steps of:
   (i) selectively forming an isolation region on the substrate so as to surround said single crystal semiconductor region, said single crystal semiconductor region having a first conductivity type;
   (ii) forming a polycrystalline semiconductor layer on said single crystal semiconductor region, said polycrystalline semiconductor layer extending to a portion of said isolation region adjacent to said single crystal semiconductor region;
   (iii) selectively ion-implanting second conductivity type impurities into said polycrystalline semiconductor layer at a portion in which an extrinsic base region is formed;
   (iv) selectively forming a dielectric layer on said polycrystalline semiconductor layer, so that said dielectric layer is provided with an opening to expose therefrom said portion of said polycrystalline semiconductor layer formed on said single crystal semiconductor region;
   (v) removing the exposed portion of said polycrystalline semiconductor layer until the corresponding portion of said single crystal semiconductor region is exposed by using an etchant having a higher etching capacity for said polycrystalline semiconductor layer then for said single crystal semiconductor region, wherein a predetermined amount of undercut is provided in said polycrystalline semiconductor layer under said dielectric layer around said opening;
   (vi) epitaxially growing a semiconductor layer on said exposed portion of said single crystal semiconductor region so that said removed portion of said polycrystalline semiconductor layer is filled with said epitaxially grown semiconductor layer;
   (vii) annealing the substrate so that said second conductivity type impurities ion-implanted in said polycrystalline semiconductor layer diffuses into at least the periphery of said epitaxially grown semiconductor layer, such that an extrinset base region is formed in the periphery of said epitaxially grown layer;
   (viii) selectively ion-implanting second conductivity type impurities and first conductivity type impurities into said epitaxially grown semiconductor layer, so that the region between the base and emitter regions for said bipolar transistors are formed in a single crystal region of said epitaxially grown semiconductor layer; and
   (ix) selectively forming a conductor layer on said epitaxially grown semiconductor layer doped with said first conductivity type impurities, such that an emitter electrode for said bipolar transistor is provided.

2. A method as set forth in claim 1, wherein the substrate is a single crystal silicon wafer.

3. A method as set forth in claim 1, wherin said substrate includes a buried layer formed under said single crystal semiconductor region, said buried layer being highly doped with first conductivity type impurities.

4. A method as set forth in claim 3, wherein said substrate has a collector contact region connected to said buried layer, said collector contact region being separated from said single crystal semiconductor region with said isolation region.

5. A method as set forth in claim 1, wherein said first conductivity type impurities are donors.

6. A method as set forth in claim 1, wherein said first conductivity type impurities are acceptors.

7. A method as set forth in claim 1, wherein said single crystal semiconductor region is formed from a silicon layer.

8. A method as set forth in claim 2, wherein said single crystal semiconductor layer is a silicon layer epitaxially grown on said silicon substrate.

9. A method as set forth in claim 1, wherein said isolation region is formed from an insulating layer.

10. A method as set forth in claim 9, wherein said insulating layer forming said isolation region is a silicon dioxide layer.

11. A method as set forth in claim 7, wherein said isolation region is formed by selectively oxidizing the periphery of said single crystal semiconductor region.

12. A method as set forth in claim 1, wherein said polycrystalline semiconductor layer is a polysilicon layer.

13. A method as set forth in claim 12, wherein said dielectric layer is a silicon dioxide layer formed by selectively oxidizing said polysilicon layer.

14. A method as set forth in claim 13, wherein said step (iv) follows a further step for selectively masking a portion of said polycrystalline layer, corresponding to said opening, with an oxidation resistive layer.

15. A method as set forth in claim 14, wherein said oxidation resistive layer is a silicon nitride layer.

16. A method as set forth in claim 1, wherein said step (iii) is performed after forming of said dielectric layer on said polycrystalline semiconductor layer.

17. A method as set forth in claim 2, wherein said silicon wafer includes a surface having crystal orientation (111).

18. A method as set forth in claim 17, wherein said step (v) is performed by using an etchant selected from a group including respective solutions of potassium hydroxide, ethylene diamine and hydrazine.

19. A method as set forth in claim 1, wherein said step (vi) is performed by a chemical vapor deposition.

20. A method as set forth in claim 1, wherein said step (vi) is performed by a liquid phase epitaxy.

21. A method as set forth in claim 1, wherein said step (viii) is performed by an ion implantation.

22. A method as set forth in claim 1, wherein said predetermined amount of said undercut provided in said polycrystalline semiconductor layer is at least equal to the thickness of said polycrystalline semiconductor layer.

* * * * *